United States Patent
Richter

(10) Patent No.: US 10,079,171 B2
(45) Date of Patent: Sep. 18, 2018

(54) COMBINED METHOD FOR PRODUCING SOLIDS, INVOLVING LASER TREATMENT AND TEMPERATURE-INDUCED STRESSES TO GENERATE THREE-DIMENSIONAL SOLIDS

(71) Applicant: SILTECTRA GMBH, Dresden (DE)

(72) Inventor: Jan Richter, Dresden (DE)

(73) Assignee: Siltectra, GmbH (DE)

( * ) Notice: Subject to any disclaimer, the term of this patent is extended or adjusted under 35 U.S.C. 154(b) by 0 days.

(21) Appl. No.: 15/309,224

(22) PCT Filed: Oct. 8, 2014

(86) PCT No.: PCT/EP2014/071511
§ 371 (c)(1),
(2) Date: Mar. 5, 2017

(87) PCT Pub. No.: WO2015/165552
PCT Pub. Date: Nov. 5, 2015

(65) Prior Publication Data
US 2017/0250109 A1    Aug. 31, 2017

(30) Foreign Application Priority Data
Apr. 30, 2014   (DE) .................. 10 2014 006 328

(51) Int. Cl.
*H01L 21/30* (2006.01)
*H01L 21/762* (2006.01)
(Continued)

(52) U.S. Cl.
CPC .... *H01L 21/76251* (2013.01); *B23K 26/0057* (2013.01); *B23K 26/53* (2015.10);
(Continued)

(58) Field of Classification Search
CPC ............. H01L 21/268; H01L 21/76251; H01L 21/76254; H01L 21/84; B23K 26/53; B23K 26/0057
(Continued)

(56) References Cited

U.S. PATENT DOCUMENTS

2009/0246934 A1* 10/2009 Yamazaki ......... H01L 21/76254
438/455
2011/0053347 A1* 3/2011 Shimomura ...... H01L 21/76254
438/458
(Continued)

FOREIGN PATENT DOCUMENTS

| JP | 2006140356 | 6/2006 |
| JP | 2012091233 | 5/2012 |

(Continued)

OTHER PUBLICATIONS

Written Opinion of the International Searching Authority for corresponding PCT application PCT/EP2014/071511.
(Continued)

*Primary Examiner* — Brook Kebede
(74) *Attorney, Agent, or Firm* — Great Lakes Intellectual Property, PLLC.

(57) ABSTRACT

The present invention relates to a method for the production of at least one three-dimensional layer of solid material, in particular for usage as wafer, and/or at least one tree-dimensional solid body. The inventive method preferably comprises the following steps:
providing a work piece for removing of layers of solid material and/or the solid bodies,
wherein the work piece comprises at least one exposed surface,
generating defects inside the work piece,
wherein the defects define at least one crack directing layer,
(Continued)

Figure 2B:
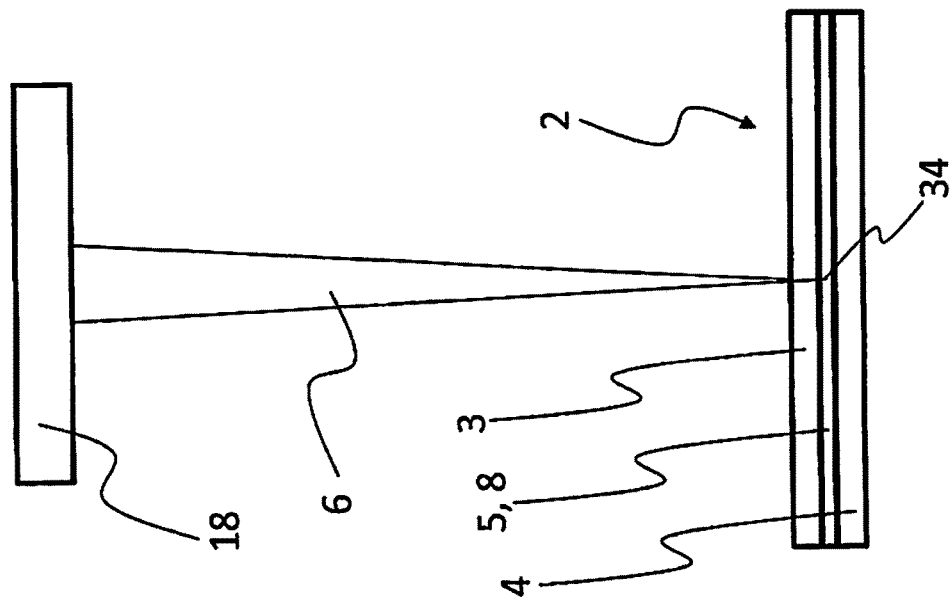

wherein the crack directing layer describes at least one three-dimensional contour;

attaching or generating a receiving layer at the exposed surface of work piece by forming a composite structure, thermal treating of the receiving layer for generating stresses inside the work piece, wherein the stresses are causing a crack propagation inside the work piece, wherein a layer of solid material or a three-dimensional solid body is separated along the crack directing layer due to the crack propagation, wherein a surface of the layer of solid material or a surface of the solid body corresponds to the three-dimensional contour of the crack directing layer.

7 Claims, 5 Drawing Sheets

(51) Int. Cl.
| | |
|---|---|
| C03B 33/02 | (2006.01) |
| B23K 26/00 | (2014.01) |
| B23K 26/53 | (2014.01) |
| B28D 1/22 | (2006.01) |
| H01L 21/268 | (2006.01) |
| B23K 101/40 | (2006.01) |
| B23K 103/00 | (2006.01) |

(52) U.S. Cl.
CPC .......... *B28D 1/221* (2013.01); *C03B 33/0222* (2013.01); *H01L 21/268* (2013.01); *H01L 21/76254* (2013.01); *B23K 2201/40* (2013.01); *B23K 2203/56* (2015.10)

(58) Field of Classification Search
USPC .................................................. 438/455–459
See application file for complete search history.

(56) References Cited

U.S. PATENT DOCUMENTS

| | | | |
|---|---|---|---|
| 2013/0244364 A1* | 9/2013 | Gardner | ................ C30B 23/025 438/47 |
| 2014/0027951 A1 | 1/2014 | Srinivas | |
| 2014/0053382 A1 | 2/2014 | Yang | |

FOREIGN PATENT DOCUMENTS

| | | |
|---|---|---|
| WO | 2010072675 | 7/2010 |
| WO | 2013126927 | 8/2013 |

OTHER PUBLICATIONS

International Search Result for corresponding PCT application PCT/EP2014/071511.

\* cited by examiner

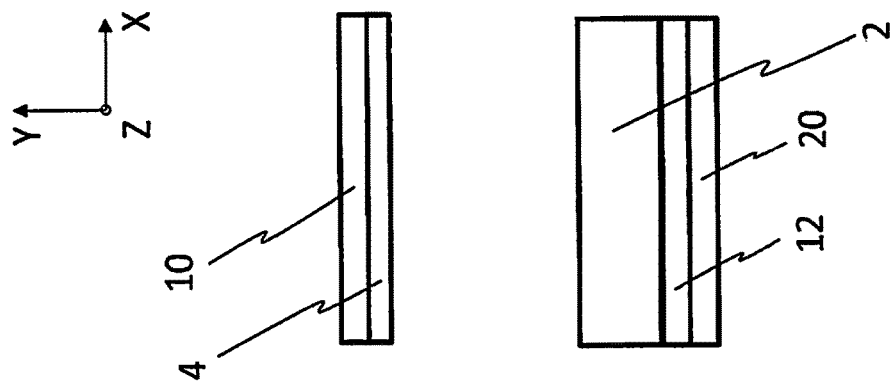
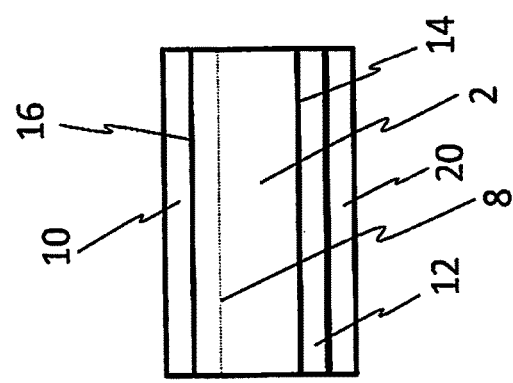
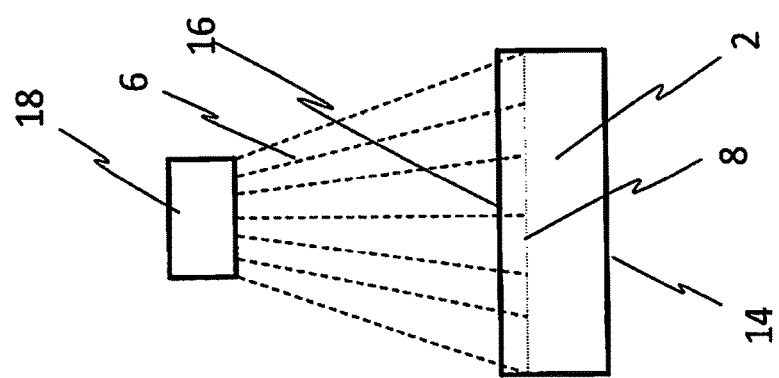

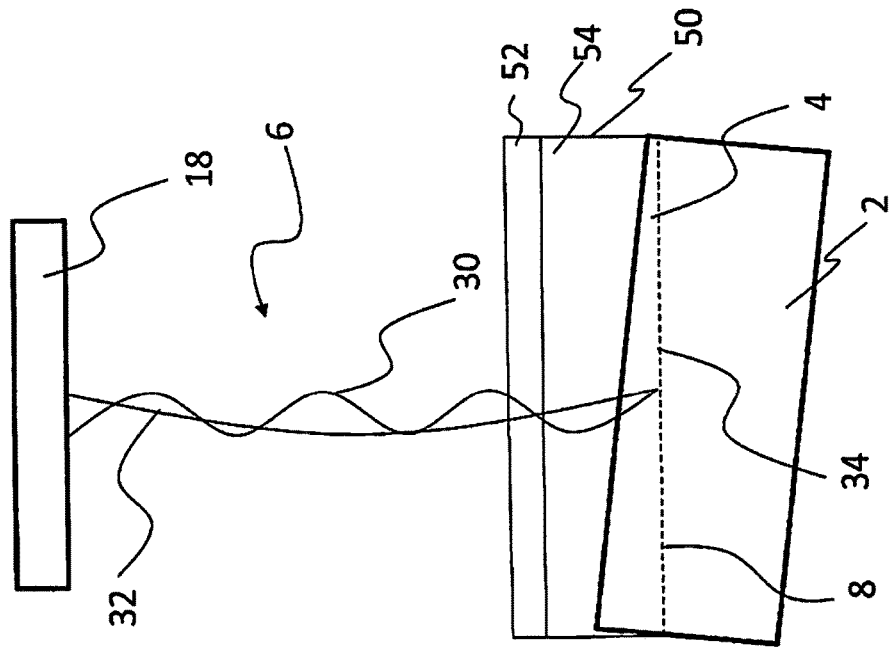
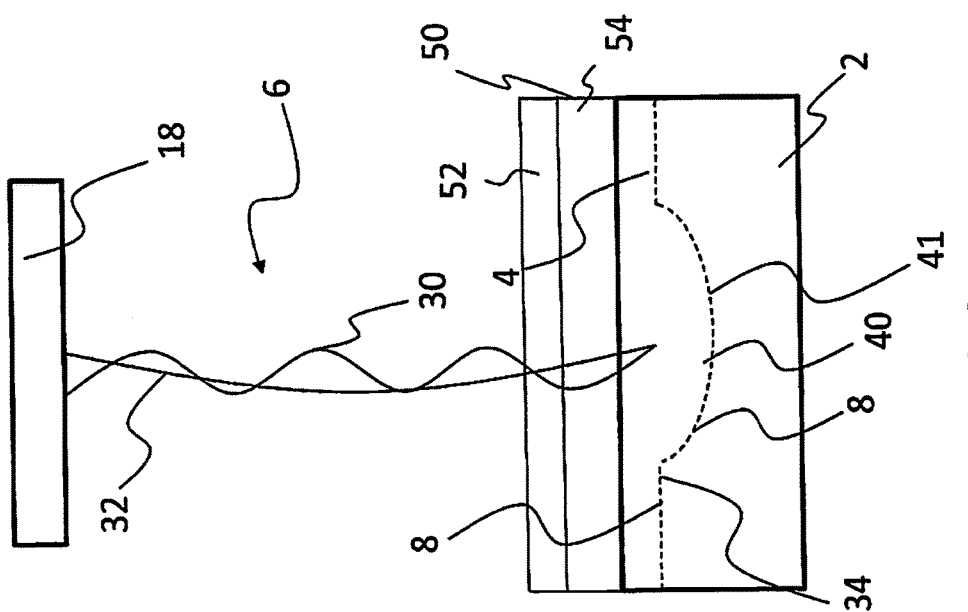

COMBINED METHOD FOR PRODUCING SOLIDS, INVOLVING LASER TREATMENT AND TEMPERATURE-INDUCED STRESSES TO GENERATE THREE-DIMENSIONAL SOLIDS

The present invention relates to a method for the production of solid bodies according to the subject matter of claim 1 and to a wafer and/or solid body produced by this method.

In many technical domains (e.g. microelectronic or photovoltaic technology) materials, such as e.g. silicon, germanium or sapphire, are often needed in the form of thin discs and plates (so-called wafers). As standard, such wafers are currently produced by sawing from an ingot, relatively large material losses ("kerf loss") occurring. Since the source material used is often very expensive, great efforts are being made to produce such wafers with less material consumption and so more efficiently and inexpensively.

For example, with the currently normal methods almost 50% of the material used is lost as "kerf loss" when producing silicon wafers for solar cells alone. Considered globally, this corresponds to an annual loss of more than 2 billion euros. Since the cost of the wafer makes up the greatest percentage of the cost of the finished solar cell (over 40%), the cost of solar cells could be significantly reduced by making appropriate improvements to the wafer production.

Methods which dispense with the conventional sawing and can separate thin wafers directly from a thicker workpiece, e.g. by using temperature-induced stresses, appear to be particularly attractive for this type of wafer production without kerf loss ("kerf-free wafering"). These include in particular methods as described e.g. in PCT/US2008/012140 and PCT/EP2009/067539 where a polymer layer applied to the workpiece is used in order to produce these stresses.

In the aforementioned methods, the polymer layer has a thermal expansion coefficient that is higher by approximately two orders of magnitude in comparison to the workpiece. Moreover, by utilizing a glass transition a relatively high elasticity modulus can be achieved in the polymer layer so that sufficiently large stresses can be induced in the polymer layer workpiece layer system by cooling in order to enable the separation of the wafer from the workpiece.

Upon separating a wafer from the workpiece, in the aforementioned methods polymer still adheres to a respective side of the wafer. The wafer bends here very strongly towards this polymer layer, and this makes it difficult to execute the separation in a controlled manner, and may lead e.g. to variations in the thickness of the separated wafer. Moreover, the strong curvature makes subsequent processing difficult and may even lead to the wafer shattering.

When using the methods according to the previous prior art, the wafers produced generally have respectively larger thickness variations, the spatial thickness distribution often showing a pattern with four-fold symmetry. The total thickness variation seen over the entire wafer ("total thickness variation", TTV) is often more than 100% of the average wafer thickness when using the previous methods (a wafer with an average thickness of, for example, 100 micrometers, that is e.g. 50 micrometers thick at its thinnest point and 170 micrometers thick at its thickest point, has a TN of 170–50=120 micrometers, which corresponds to a total thickness variation of 120% relative to its average thickness). Wafers with these strong thickness variations are unsuitable for many applications. Moreover, with the most frequently occurring four-fold thickness distribution patterns, the regions with the greatest variations unfortunately lie in the middle of the wafer where they cause the greatest disruption.

Moreover, in the method according to the current prior art, undesirable oscillations in the layer systems involved occur during the break propagation upon separation, and these oscillations have a negative impact upon the development of the break front and may in particular lead to significant thickness variations of the separated wafer.

In addition, with the previous methods it is difficult to ensure reproducibly good heat contact over the entire surface of the polymer layer. Locally insufficient heat contact may, however, lead to undesirable significant local temperature variations in the layer system due to the low thermal conductivity of the polymers used, and this on its part has a negative impact upon the controllability of the stress fields produced and so upon the quality of the wafers produced.

Furthermore, a method for the separation of semiconductor materials by means of light-induced boundary surface decomposition and apparatuses produced in this way, such as structured and free-standing semiconductor layers and components, is known from publication DE 196 40 594 A1. The method according to DE 196 40 594 A1 includes the illumination of boundary surfaces between the substrate and the semiconductor layer or between semiconductor layers, by means of which the light absorption on the boundary surface or in an absorption layer provided for this purpose leads to material decomposition.

The choice of boundary surface or semiconductor layer which can be caused to decompose is made by choosing the light wavelength and the light intensity, the irradiation direction or the insertion of a thin sacrificial layer during the material production. The disadvantage of this method is that high doses of energy have to be used in order to destroy whole layers, due to which the energy requirement, and so the costs of the process are very high.

It is therefore the object of the present invention to provide a method for the production of layers of solid material and/or solid bodies that enables the inexpensive production of uneven solid plates or solid bodies with a desired thickness distribution.

The aforementioned object is achieved according to the invention by a method for the production of at least one layer of solid material and/or at least one three-dimensional solid body, in particularly for usage as wafer, disc, lens, or parallelepiped. The method according to the invention preferably comprises the following steps: Providing a workpiece for removing the layers of solid material and/or the solid body, wherein the work piece comprises at least an exposed surface, generating defects inside the work piece, wherein the defects define at least one crack directing layer, wherein the crack directing layer describes at least one three dimensional contour, attaching or generating a receiving layer at the exposed surface of the work piece by forming a composite structure, thermal treatment of the receiving layer for the generation of stresses inside the work piece, wherein the stresses cause a crack propagation inside the work piece, wherein due to the crack propagation a three dimensional layer of solid material or a three dimensional solid body is separated from the work piece along the crack directing layer, wherein one surface of the layer of solid material or of the solid body corresponds to the three dimensional contour of the crack directing layer. Thus, not only a flat layer of solid material, but also an uneven solid body can be separated from a work piece according to the present invention as result of fracture or crack directing. Additional preferred embodiments are mentioned in the following and/or subject matter of the sub-claims.

Therefore, according to a preferred embodiment of the present invention the form of the crack directing layer has at least partially the contour of a three-dimensional object, in particular of a lens or a parallelepiped.

According to a further preferred embodiment of the present invention a defect generation apparatus, in particular an ion gun or a laser, is used for generating defects.

Attaching or generating of the receiving layer at the exposed surface of the work piece takes place according to a further preferred embodiment of the present invention before the generation of defects, wherein the receiving layer has at least one locally varying property, wherein the defects are generated by laser beams of a laser, wherein the laser beams are affected in such a manner that the defects are generated in dependency of the at least one locally varying property. Thus, the laser beams are according to this embodiment preferably directly guided though the receiving layer. In case of a correctly selected receiving layer the crack directing layer, which describes at least a three-dimensional contour, can be generated in such a manner that the receiving layer, in particularly in form of foil, is produced in the first place in a desired manner in a 3D form respectively with a 3D structuring (e.g. injection molding). The receiving layer hereby preferably consists of a polymer, in particular an elastomer or multiple elastomers, which are preferably optically stable, like e.g. some members of silicones. The receiving layer, which is attached, in particular glued, to the solid body causes during defect generation, that means during a laser treatment, due to the 3D structuring respectively 3D form, that the optical path of the laser is modified in such a suitable manner, that the desired defects, which are forming the crack directing layer, are generated. The locally varying property of the receiving layer is hereby preferably the thickness of the receiving layer.

According to a further preferred embodiment of the present invention an immersion liquid is arranged onto the exposed surface before the generation of defects and for the generation of defects a treatment of the work piece through the immersion liquid takes place. According to a further preferred embodiment of the present invention the refraction index of the immersion liquid preferably fits at least essentially to the refraction index of the solid body. This solution is beneficial since due to usage of an immersion liquid, in particularly of an oil or water, the roughness resulting during cracking or another surface treatment is compensated. Thus, it is possible due to usage of the immersion liquid to insert the defects into the work piece very precisely.

According to a further preferred embodiment of the present invention the immersion liquid is preferably applied in such a quantity onto the exposed surface that due to it at least more than half of the exposed surface and preferably the entire exposed surface is moistened.

According to a further preferred embodiment of the present invention the immersion liquid is covered by a cover plate in such a manner, that between the crack directing layer to be generated and the cover plate the same refraction index is present, in particular no air inclusions appear between the exposed surface and the cover plate.

According to a further preferred embodiment of the present invention the cover plate has at least on a side turned away from the exposed surface of the work piece a roughness which is less compared to the surface roughness of the exposed surface.

According to a further preferred embodiment of the present invention the immersion liquid is applied to the exposed surface as drop and the drop is brought into contact with the defect generation apparatus in such a manner that a relative movement between work piece and defect generation apparatus causes a reposition of the drop.

According to a further preferred embodiment of the present invention the defects are generated in a crack directing layer, wherein the crack directing layer is generated aligned with respect to the length axis of the work piece and wherein the crack directing layer and the length axis are aligned with respect to each other in an angle which differs from 90°.

According to one preferred embodiment of the present invention the defects are generated by means of a defect generation apparatus, the defect generation apparatus being configured such that the defects are generated in the workpiece a constant distance away from the defect generation apparatus, the workpiece and the defect generation apparatus being inclined relative to one another such that the defects generated by the defect generation apparatus are generated in the crack directing layer, the defect generation apparatus and the workpiece only being re-positioned two-dimensionally in relation to one another during the defect generation. The defect generation apparatus is therefore preferably re-positioned in relation to the workpiece, or the workpiece is re-positioned in relation to the defect generation apparatus, or the defect generation apparatus and the workpiece are both re-positioned in relation to one another.

This embodiment is advantageous because the defect generation device need only be repositioned in order to generate defects, and no modification needs to be made to the defect generation apparatus, and in particular no changed defect introduction depth needs to be determined or set.

According to another preferred embodiment the defects are generated by means of a defect generation apparatus, the defect generation apparatus being configured such that the defects are generated in the workpiece a distance away from the defect generation apparatus that changes from time to time, a modification of the defect generation apparatus being brought about at least from time to time depending on the distance between the defect generation apparatus and the defect to be generated, in particular a changed defect introduction depth being determined and set up. This embodiment is advantageous because preferably, no incline apparatus need be provided in order to incline the workpiece.

According to a further preferred embodiment of the present invention the defect generation apparatus becomes repositioned in a repositioning plane extending orthogonal to the length axis of the work piece and the modification of the defect generation apparatus takes place in such a manner in dependency of the position of the defect generation apparatus with respect to the work piece, that defects are generated in varying distances to the defect generation apparatus in dependency of the position of the defect generation apparatus.

According to a further preferred embodiment of the present invention the crack directing layer is aligned with respect to the length axis in an angle between 88° and 45° and preferably between 87° and 60° and particular preferably between 86° and 80°.

This embodiment is beneficial since a crystal (an ingot) does not always grow into the desired direction during crystal growing, instead crystal growing has tolerances in the range of angular degree and some crystals are outside the desired specifications. Due to the solution, according to the invention crack directing layers can be preferably generated, whereby despite the problems occurring during crystal growth suitable layers of solid material are produceable, whereby losses can be decreased significantly.

According to a further preferred embodiment of the present invention defects are generated inside the work piece for forming of at least a first crack directing layer and a second crack directing layer, wherein a plurality of defects forming the first crack directing layer have corresponding defects in the second crack directing layer, wherein each defect of the first crack directing layer and each defect corresponding with said defect of the first crack directing layer of the second crack directing layer are generated in the same direction, due to crack propagation a layer of solid material is preferably removed from the work piece along the first crack directing layer and/or along the second crack directing layer. This solution is beneficial since during a treatment of two, three, four or more planes at the same time respectively immediately one after another mistakes, e.g. by usage of a laser are minimized due to laser access into the surface, since only the differences of both focus values are important and since the surface does not affect the difference. Therewith, in particular very thin, wafers with very precise TTV and significantly minimized bow and warp can be produced. Both crack directing layers, which are preferably generated as planes, can be configured in such a manner that during cracking a first crack directing layer (e.g. the second crack directing layer) and then the other respectively a further crack directing layer (e.g. the first crack directing layer) splits.

According to a preferred embodiment of the present invention a defect generation apparatus, in particular an ion gun or a laser, is used for generating defects, wherein the corresponding defects of the first crack directing layer and of the second crack directing layer are each time generated one after another.

The defect generation apparatus and the surface of the work piece are according to a further preferred embodiment of the present invention relatively aligned to each other for generation of at least two defects which are corresponding with each other.

According to a preferred embodiment of the present invention the defect generation apparatus and the surface of the work piece are newly rearranged relatively to each other after generation of at least two defects corresponding with each other in such a manner that at least two further defects which are corresponding with each other are generated.

According to a preferred embodiment of the present invention the defects of the first crack directing layer are further spaced apart from the surface of the work piece compared to the respective corresponding defects of the second crack directing layer, wherein with respect to two corresponding defects the defect partially forming the first crack directing layer is generated first and afterwards the defect partially forming the second crack directing layer is generated.

The first crack directing layer and/or the second crack directing layer are comprising according to a further preferred embodiment of the present invention the shape of a plane or are comprising at least partially a shape differing from a flat shape, in particularly partially the shape of a parallelepiped or a lens.

The solid body respectively the work piece preferably comprises a material or a material combination of one of the main groups 3, 4 and 5 of the periodic table of the elements, such as e.g. Si, SiC, SiGe, Ge, GaAs, InP, GaN, Al2O3 (sapphire), AlN. Particularly preferably, the solid body has a combination of elements occurring in the third and the fifth group of the periodic table. Conceivable materials or material combinations here are e.g. gallium arsenide, silicon, silicon carbide etc. Furthermore, the solid body can comprise a ceramic (e.g. Al2O3—aluminium oxide) or be made of a ceramic, preferred ceramics here being e.g. perovskite ceramics (such as e.g. ceramics containing Pb, O, Ti/Zr) in general and lead magnesium niobates, barium titanate, lithium titanate, yttrium aluminium garnet, in particular yttrium aluminium garnet crystals for solid body laser applications, SAW (Surface Acoustic Wave) ceramics, such as e.g. lithium niobate, gallium orthophosphate, quartz, calcium titanate, etc. in particular. Therefore, the solid body preferably comprises a semiconductor material or a ceramic material, or particularly preferably the solid body is made of at least one semiconductor material or a ceramic material. Furthermore, it is conceivable for the solid body to comprise a transparent material or to be made of or to be produced partially from a transparent material such as e.g. sapphire. Additional materials that can be considered as a solid material here on their own or in combination with another material are e.g. "wide band gap" materials, InAlSb, high temperature superconductors, in particular rare earth cuprates (e.g. YBa2Cu3O7). It is additionally or alternatively conceivable that the solid body is a photo mask, wherein in the present case as photo mask material preferably each photo mask material known at the application date and particular preferably combinations therefrom can be used.

Furthermore, the invention relates to a wafer that is produced by a method according to any of claims 1 to 5.

According to a preferred embodiment defects are generated by means of at least one defect generation apparatus, in particular a laser, inside an inner structure of the work piece for defining a crack directing layer, along which the layer of solid material or the solid body will be removed, wherein the defects are generated spaced apart from each other in such a manner that a local heating of the work piece during the respective defect generation is decoupled from a further heating resulting from the generation of a further defect, wherein preferably each local heating of the work piece during each respective defect generation is decoupled from further heatings of the work piece resulting from the generation of further defects.

This embodiment is beneficial since the individual local heatings can cool down unhinderedly and no additional heating of a part of the work piece is caused due to defects generated side by side, whereby the generation of high local stresses is prevented.

The present invention may further refer to a method for the production of layers of solid material or uneven solid bodies, which preferably comprises at least the following steps:

Providing a solid body for removing at least one layer of solid material or an uneven solid body, generating of defects by means of at least one defect generation apparatus, in particular a laser, inside the inner structure of the work piece for defining a crack directing layer along which the layer of solid material or the solid body will be removed from the work piece, wherein the defects are generated spaced apart from each other in such a manner, that a local heating of the work piece of a respective defect generation is decoupled from further heatings resulting during the generation of further defects, wherein preferably each local heating of the respective defect generation is decoupled from further heatings occurring during the generation of further defects, attaching or generating of a receiving layer at an exposed surface of the work piece while forming a composite structure, thermal treatment of the receiving layer for the generation of stresses inside the work piece, wherein the stresses are causing a crack propagation inside the work piece, wherein a layer of solid material or a solid body is removed along the crack directing layer due to the crack propagation. This solution is beneficial since the individual local heatings can cool down unhindertly and no additional heating of a part of the work piece is caused due to defects generated side by side, whereby the generation of high local stresses is prevented.

According to a preferred embodiment of the present invention the defects are generated according to a predefined pattern.

According to a preferred embodiment of the present invention the order of defects is generated by an algorithm.

Furthermore, the subject matter of publications PCT/US2008/012140 and PCT/EP2009/067539 is made complete by referring to the subject matter of the present patent application.

Other advantages, aims and properties of the present invention are explained by means of the following description of the attached drawings in which the wafer production according to the invention is shown as an example. Components or elements of the wafer production according to the invention which in the figures correspond, at least substantially with regard to their function, can be identified here by the same reference signs, these components or elements not having to be numbered or explained in all of the figures.

Individual or all of the illustrations of the figures described below are preferably to be considered as design drawings, i.e. the dimensions, proportions, functional relationships and/or arrangements shown by the figure or figures preferably correspond precisely or preferably substantially to those of the apparatus according to the invention or of the product according to the invention.

Figure 2A:
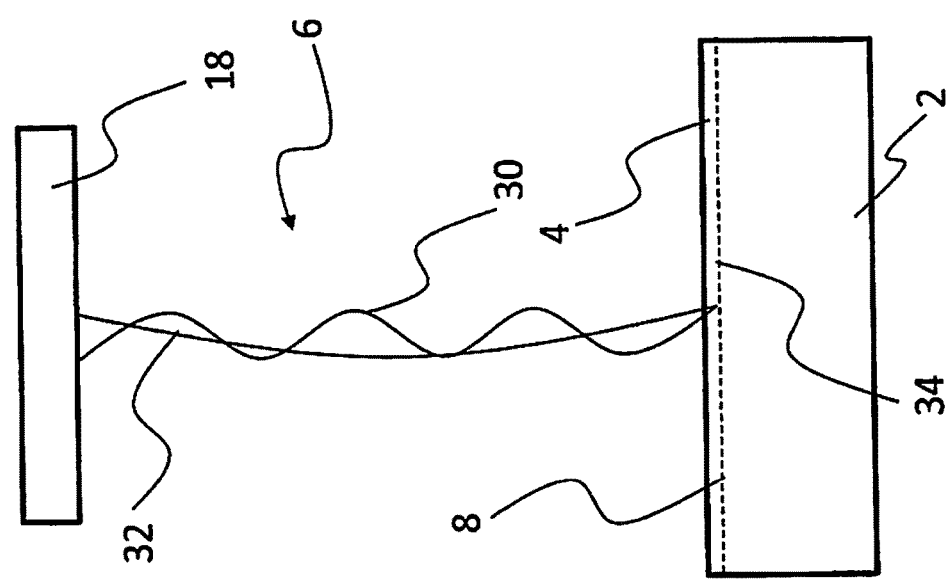
Figure 4D:
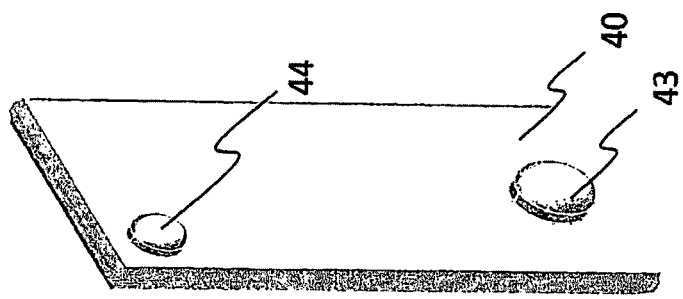
Figure 4A:
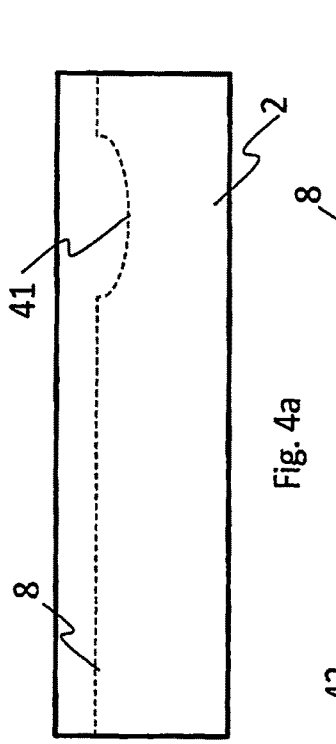
Figure 4B:
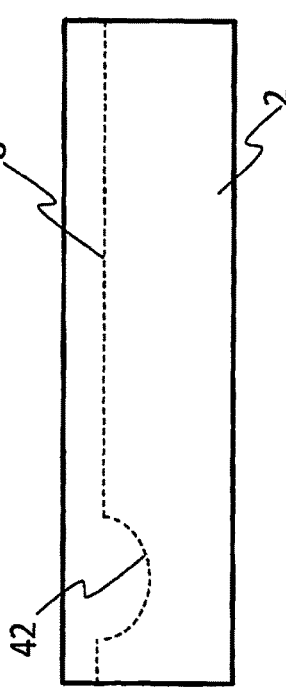
Figure 4C:
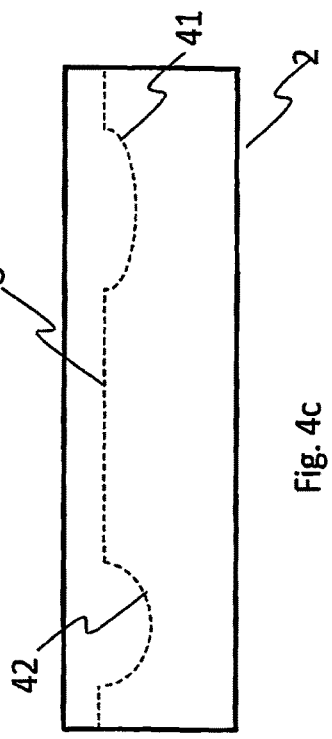
Figure 5:
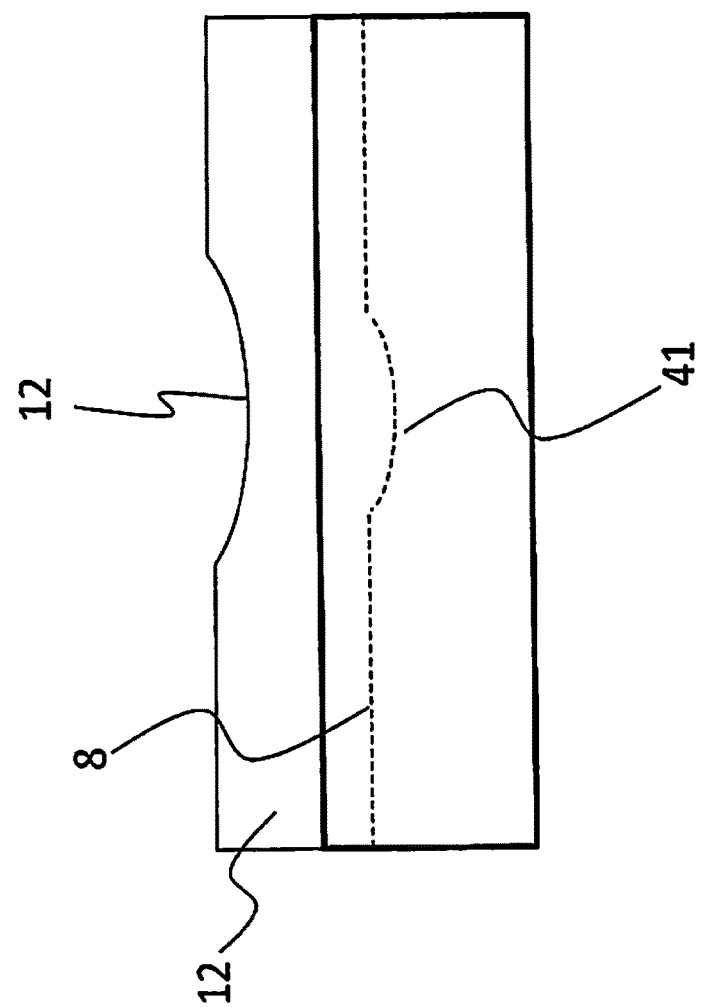

The figures show as follows:

FIG. 1a a diagrammatic construction for generating local stresses in a solid body;

FIG. 1b a diagrammatic illustration of a layer arrangement before separating a layer of solid material from a solid body;

FIG. 1c a diagrammatic illustration of a layer arrangement after separating a layer of solid material from a solid body;

FIG. 2a a first diagrammatically illustrated variation for generating of local stresses by means of radiation, in particularly light waves;

FIG. 2b a second diagrammatically illustrated variation for generating of local stresses by means of radiation, in particularly by means of light waves;

FIG. 3a the generation of a three-dimensional crack directing layer;

FIG. 3b the generation of a further crack directing layer for the generation of a three-dimensional solid body;

FIG. 4a-4c examples of different 3d contours of the crack directing layer;

FIG. 4d an example for a generated solid body according to the present invention; and FIG. 5 a further arrangement for the generation of a crack directing layer with a 3d contour.

FIG. 1a shows a work piece 2 or a substrate that is disposed in the region of a radiation source 18, in particular a laser. The work piece 2 preferably has a first, in particular flat, surface portion 14 and a second, in particular flat, surface portion 16, the first level surface portion 14 preferably being aligned substantially or exactly parallel to the second level surface portion 16. The first level surface portion 14 and the second level surface portion 16 preferably delimit the work piece 2 in a Y direction that is preferably aligned vertically or perpendicularly. The level surface portions 14 and 16 preferably extend respectively in an X-Z plane, the X-Z plane preferably being aligned horizontally.

Furthermore, it can be gathered from this illustration that the radiation source 18 irradiates rays 6 at the same time or at different times onto the work piece 2. The rays 6 penetrate by a defined depth into the work piece 2 depending on the configuration and generate local stresses at the respective position or at a predetermined position.

FIG. 1b shows a multi-layered arrangement, the work piece 2 containing the crack directing layer 8 and being provided in the region of the first level surface portion 14 with a holding layer 12 which is in turn preferably overlaid by an additional layer 20, the additional layer 20 preferably being a stabilisation device, in particular a metal plate. A polymer layer 10 is preferably disposed on the second level surface portion 16 of the work piece 2. The receiving layer respectively polymer layer 10 and/or the holding layer 12 are preferably made at least partially and particularly preferably entirely of PDMS.

FIG. 1c shows a state after a crack initiation and subsequent crack directing. The layer of solid material 4 adheres to the polymer layer 10 and is or can be spaced apart from the remaining part of the work piece 2.

FIGS. 2a and 2b show examples of the generation, shown in FIG. 1a, of a crack directing layer 8 by introducing local stresses into a work piece 2, in particular by means of light rays.

Therefore, the present invention relates to a method for the production of layers of solid material. This method according to the invention includes at the very least the steps of providing a work piece 2 for the separation of at least one layer of solid material 4, generating preferably defined local stresses respectively local stresses by means of at least one radiation source, in particular a laser, in the inner structure of the solid body in order to determine a crack directing layer along which the layer of solid material is separated from the solid body, and applying heat to a polymer layer 10 disposed on the work piece 2 in order to generate, in particular mechanically, removing-stresses in the work piece 2, due to the removing-stresses a crack propagating in the work piece 2 along the crack directing layer 8, which crack separates the layer of solid material 4 from the work piece 2.

Therefore, FIG. 2a shows diagrammatically how local stresses 34 can be generated in a work piece 2, in particular in order to generate a crack directing layer 8 by means of a radiation source 18, in particular one or more lasers. Here the radiation source 18 emits radiation 6 with a first wavelength 30 and a second wavelength 32. The wavelengths 30, 32 are preferably matched to one another here or the distance between the radiation source 18 and the crack directing layer 8 to be generated is preferably matched such that the waves 30, 32 converge substantially or precisely on the crack directing layer 8 in the work piece 2, by means of which local stresses respectively defects are generated at the point of coinciding 34 as a result of the energies of the two waves 30, 32. The generation of local stresses can take place here by means of different or combined mechanisms such as e.g. sublimation, fuzing and/or chemical reaction.

FIG. 2b shows a focussed light ray 6, the focal point of which preferably lies in the crack directing layer 8. It is conceivable here for the light ray 6 to be focussed by one or more focussing bodies, in particular a lens/lenses (not shown). In this embodiment, the work piece 2 is multi-layered in form and preferably has a partially transparent or transparent substrate layer 3 or material layer that is preferably made of sapphire or comprises sapphire. The light rays 6 pass through the substrate layer 3 onto the crack directing layer 8 which is preferably formed by a sacrificial layer 5, the sacrificial layer 5 being exposed to radiation such that the generation of local stresses inside the sacrificial layer 5 is brought about in the focal point or in the region of the focal point. It is also conceivable for the local stresses for the generation of the crack directing layer 8 to be generated in the region of or precisely on a boundary surface between two layers 3, 4. It is therefore also conceivable for the layer of solid material 4 to be generated on a support layer, in particular a substrate layer 3, and for a crack directing layer 8 for the detachment or separation of the layer of solid material 4 to be able to be generated by means of one or more sacrificial layers 5 and/or or by means of the generation of local stresses in a boundary surface, in particular between the layer of solid material 4 and the support layer.

According to FIG. 3a an essentially similar illustration with respect to the illustration of FIG. 2a is shown. However, the defect generation apparatus 18 is configured in such a manner that the defects 34 are generated at least sectionally in multiple planes spaced apart from each other, whereby at least sectionally one or multiple crack directing layers 8 are generated, which correspond to the surface respectively contour of the surface of a three-dimensional body.

Thus, due to the present invention not only a flat layer of solid material 4 can be produced but also an uneven solid body 40 can be extracted as result of a crack or a crack guiding from the work piece 2. It is further conceivable that a solid body 40 at least sectionally flat and sectionally three dimensional will be extracted from work piece 2.

It is further conceivable that an immersion liquid 54 will be arranged on the exposed surface of work piece 2 as drop or, as shown, as liquid layer. In case immersion liquid 54 is provided as liquid layer, then preferably also a wall device 50 for forming a receiving tub is provided, to hold the liquid in a desired position. Furthermore, a cover plate 52 can be arranged on the liquid, in particular put on or dunk into the liquid. Immersion liquid 54 has preferably essentially or exactly the same refraction index as work piece 2. The refraction index of cover plate can vary from the refraction index of immersion liquid or also match with it. Thus, it is particular preferably conceivable that, in particular for elimination of surface roughness, defect generation is caused through immersion liquid 54 and particular preferably trough immersion liquid 54 and cover plate 52. The focus of laser 18 is preferably computer controlled guided for defect generation.

FIG. 3b shows a further arrangement, according to which a crack directing layer 8 for removing an uneven layer of solid material 4 respectively an uneven solid body 40 is generated inside an inclined work piece 2, in particularly an ingot. For a precise generation of the crack directing layer 8 an immersion liquid 54 is preferably provided. It is applied as drop or as liquid layer (as illustrated) onto the exposed surface of work piece 2. In case that the immersion liquid 54 is provided as liquid layer a wall device 50 is preferably provided for forming a receiving tub to hold the liquid at the desired position. Furthermore, a cover plate 52 can be arranged on said liquid, in particular put onto or dunk into said liquid. The immersion liquid 54 preferably has essentially or exactly the same refraction index as the work piece 2. The immersion liquid 54 causes that the refraction index in the path between cover plate 52 and the crack directing layer 8, which is to be generated, is always the same to enable a preferably error-free defect generation.

FIG. 4a illustrates a work piece 2, which preferably consist of sapphire or comprises sapphire and in which a crack directing layer 8 is generated by means of implanted respectively generated defects 34. Hereby, crack directing layer 8 comprises a flat and a curved contour section. The first contour section 41 may correspond to e.g. a contour of a lens. It is further conceivable that the crack directing layer 8 has no flat but only curved contour parts or contour parts which are inclined to each other.

Crack directing layer 8 is formed in FIG. 4b in such a manner that the second 3D contour is smaller and higher compared to the first 3D contour 41. It is hereby conceivable that a 3D contour or multiple, in particular 2, 3, 4, 5, 6, 7 or more than 7 3D contours, are forming one crack directing layer 8. It is further conceivable, that a 3D contour 41/42 is generated in the centre or spaced apart from the centre of the crack directing layer 8. Hereby, the 3D contour 42 may have e.g. partially or fully the shape of a sensor, in particularly a touch sensor, or a part of a sensor housing.

FIG. 4c shows an illustration according to which a crack directing layer 8 comprises multiple, in particular two, 3D contours. An example, how the solid body 40 resulting thereof can look like it is shown in FIG. 4d. FIG. 4d shows a single-piece solid body which comprises flat portions and multiple, in particular two, identical or differently shaped 3D body parts 43, 44.

FIG. 5 shows an illustration according to which a structured foil is arranged on a work piece 2. It is hereby conceivable that the foil is pre-structured or that the foil becomes structured onto the work piece 2. The foil is preferably produced structured and glued onto work piece 2. The structure of the foil is preferably selected in such a manner that laser beams of a defect generation apparatus 18 are deflected due to the shape of the foil in such a manner that a pre-defined 3D contour of a crack directing layer 8 is generated.

LIST OF REFERENCE SIGNS 2 work piece
3 substrate
4 layer of solid material
5 sacrificial layer
6 radiation
8 crack directing layer
10 polymer layer/receiving layer
12 holding layer
14 first level surface portion
16 second level surface portion
18 radiation source/defect generation apparatus
20 stabilization device
30 first radiation portion
32 second radiation portion
34 location of local-stresses/defect generation
40 solid body
41 first 3D contour
42 second 3D contour
43 first 3D body
44 second 3D body
50 wall
52 cover plate
54 immersion liquid
X first direction
Y second direction
Z third direction

The invention claimed is:
1. A method for the production of at least one three-dimensional layer of solid material for usage as wafer and/or at least one three-dimensional solid body, the method comprising:

providing a work piece for removing of layers of solid material and/or the solid body, wherein the work piece includes a first level surface portion and a second level surface portion, wherein the first level surface portion aligns substantially or exactly parallel to the second level surface portion;

wherein the work piece includes at least one exposed surface formed by the second level surface portion;

generating defects inside the work piece with laser beams of a laser, wherein the laser beams penetrate into the solid body through the second level surface portion;

wherein the defects define at least one crack directing layer;

wherein the crack directing layer describes at least one three-dimensional contour;

attaching or generating a receiving layer at the exposed surface of the work piece by forming a composite structure;

thermal treating of the receiving layer to generate stresses inside the work piece, wherein the stresses cause a crack propagation inside the work piece;

wherein a layer of solid material or a three-dimensional solid body is separated along the crack directing layer due to the crack propagation, wherein a surface of the layer of solid material or a surface of the solid body corresponds to the three-dimensional contour of the crack directing layer; and wherein a shape of the crack directing layer has at least sectionally a contour of a pre-defined three-dimensional object, wherein the contour represents a mathematically definable form body.

2. The method of claim 1 wherein the mathematically definable form body is a lens or a parallelepiped.

3. The method of claim 1 wherein a defect generation apparatus is used for the generation of the defects.

4. The method of claim 3 wherein the defect generation apparatus is a ion gun or a laser.

5. The method of claim 1 further comprising attaching or generating of the receiving layer at the exposed surface of the work piece before the generation of the defects, wherein the receiving layer includes at least one locally varying property, wherein the laser beams are biased from the receiving layer in such a manner that the defects are generated in dependency of the at least one locally varying property.

6. The method of claim 5 wherein the thickness of the receiving layer is the locally varying property.

7. A wafer or uneven solid body produced by the method of claim 1.

* * * * *